United States Patent [19]
Latz et al.

[11] Patent Number: 5,122,252
[45] Date of Patent: Jun. 16, 1992

[54] ARRANGEMENT FOR THE COATING OF SUBSTRATES

[75] Inventors: Rudolph Latz, Frankfurt am Main; Michael Scherer, Rodenbach, both of Fed. Rep. of Germany

[73] Assignee: Leybold Aktiengesellschaft, Hanau, Fed. Rep. of Germany

[21] Appl. No.: 637,973

[22] Filed: Jan. 9, 1991

Related U.S. Application Data

[63] Continuation of Ser. No. 413,975, Sep. 28, 1989, abandoned.

[30] Foreign Application Priority Data

Jun. 24, 1989 [DE] Fed. Rep. of Germany ....... 3920835

[51] Int. Cl.⁵ .............................................. C23C 14/35
[52] U.S. Cl. ........................... 204/298.26; 204/298.19; 204/192.12
[58] Field of Search ...................... 204/192.12, 298.04, 204/298.16, 298.17, 298.19, 298.26

[56] References Cited

U.S. PATENT DOCUMENTS

| | | | |
|---|---|---|---|
| 4,492,620 | 1/1985 | Matsuo et al. | 204/192.12 |
| 4,774,437 | 9/1988 | Helmer et al. | 315/111.81 |
| 4,851,095 | 7/1989 | Scobey et al. | 204/192.12 |
| 4,946,576 | 8/1990 | Dietrich et al. | 204/298.06 |

FOREIGN PATENT DOCUMENTS

| | | |
|---|---|---|
| 0103461 | 3/1984 | European Pat. Off. |
| 0205028 | 12/1985 | European Pat. Off. |
| 0302684 | 1/1988 | European Pat. Off. |
| 3830478 | 7/1989 | Fed. Rep. of Germany |
| 3803355 | 8/1989 | Fed. Rep. of Germany |
| 3834984 | 4/1990 | Fed. Rep. of Germany |
| 63-114966 | 5/1988 | Japan ........................ 204/298.26 |
| 2180262 | 3/1987 | United Kingdom ........... 204/298.26 |

OTHER PUBLICATIONS

D. M. Goebel et al, "Plasma Surface Interaction Experimental Facility (Pisces) For Materials and Edge Physics Studies," *Journal of Nuclear Materials*, vol. 121 (1984) pp. 277-282.

*Primary Examiner*—Aaron Weisstuch
*Attorney, Agent, or Firm*—Fitch, Even, Tabin & Flannery

[57] ABSTRACT

The invention relates to an arrangement for the vapor deposition of thin layers on a substrate. This arrangement comprises a magnetron cathode with a target disposed opposite the substrate. With the aid of a particle generator ions of a reactive gas are generated and accelerated toward the substrate where a reaction takes place between target particles and reactive gas particles.

6 Claims, 3 Drawing Sheets

ARRANGEMENT FOR THE COATING OF SUBSTRATES

CROSS-REFERENCED TO RELATED APPLICATIONS

This is a continuation of U.S. patent application Ser. No. 07/413,975, filed Sep. 28, 1989, now abandoned.

The invention relates to an arrangement for the deposition of thin layers beyond a substrate.

BACKGROUND OF THE INVENTION

In numerous fields of technology it is required to apply very thin layers of pure substances on particular objects. Examples of this are window panes which are provided with a thin metal or metal oxide layer to filter out particular wavelength ranges from the sunlight. In the semiconductor technology often thin layers of a second substrate are applied onto a first substrate. Herein is of particular importance that the thin layers are not only very pure but must also be apportioned very precisely so that the particular layer thicknesses are exactly reproducible in each instance.

Thin layers can be applied by chemical or electrochemical deposition, by vapor deposition in a vacuum or by "sputtering" or cathode disintegration. In cathode sputtering there are provided in a vacuum chamber a gas discharge plasma, substance on a cathode to be sputtered—also called target—and a substrate to be coated.

An arrangement for applying thin layers on a substrate by means of the cathode sputtering method is already known in which between a cathode to be sputtered and an anode a mechanical shutter is provided which divides the space between the cathode and the substrate to be coated (EP-A-0 205 028). In this arrangement, however, only a relatively small fraction of the particles sputtered off the target deposits on the substrate.

Arrangements are known which function for the generation of charged particles which in turn can be used for a coating process (D. M. Goebel, G. Campbell and R. W. Conn in *Journal of Nuclear Material* 121, 1984, pages 277 to 282, North Holland Physics Publishing Division, Amsterdam; German Patent Application 38 03 355.0; German Patent Application P 38 34 984.1).

The present invention is based on the task of using particle sources in advantageous manner for the coating of substrates.

This task is solved according to the features of the present invention.

The advantage achieved with the invention comprises in particular in that nearly all chemical compounds, for example oxides, nitrides, etc. can be generated through DC current sputtering with very high deposition rates. In contract to conventional reactive sputtering in reactive atmospheres, in the invention ions of the reaction gas component are led directly from one or several sources disposed outside the sputter plasma to the substrate where they react with the atoms of the solid component sputtered off the target. Since these ions on the one hand are themselves very reactive and on the other hand upon their impinging on the substrate surface activate the latter, molecules, atoms and ions of the reactive gases can be largely kept away from the sputter target so that it can be sputtered in the metallic state.

DESCRIPTION OF THE DRAWING

Embodiments of the invention are represented in the drawing and are described below in greater detail. In the drawing.

DESCRIPTION OF THE INVENTION

Figure 1:
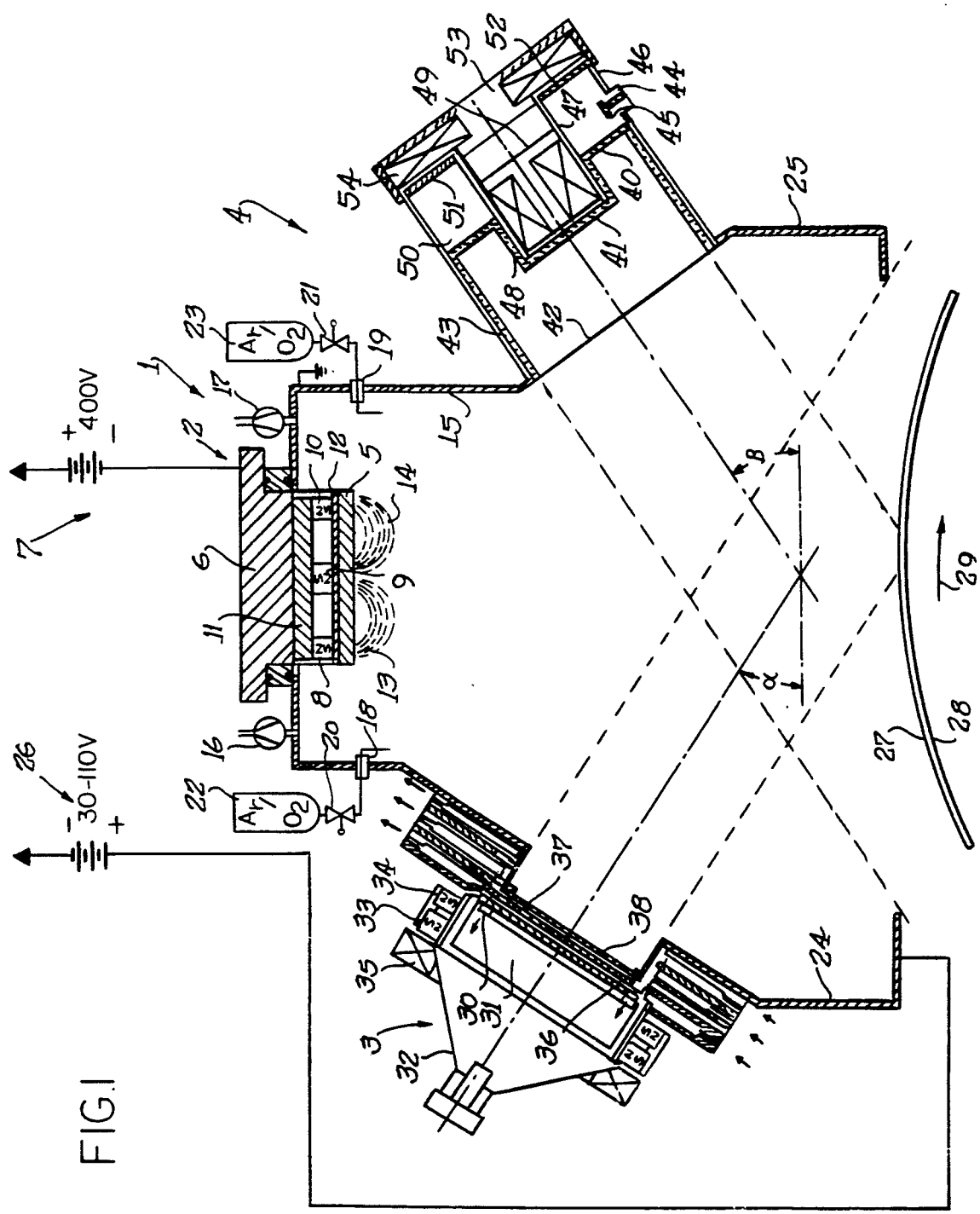
FIG. 1—shows a sputter installation with two different ion sources.

In FIG. 1 a coating installation 1 is shown which comprises a sputtering arrangement 2 and two ion sources 3, 4 of different implementation. The sputtering arrangement 2 comprises a target 5, an electrode 6 connected to the negative potential of a voltage source 7, through permanent magnets 8, 9, 10 coupled with each other via a yoke 11 and a magnet carrier 12 which, on the one hand, is connected with the electrode 6 and, on the other hand, with the target 5. The permanent magnets 8, 9, 10 are arranged so that their north or south poles alternate and between them magnetic cusp field lines extend as indicated by the reference numbers 13, 14.

The sputtering arrangement 2 is disposed in the upper region of a chamber 15, which is provided with vacuum pumps 16, 17 and gas feeds 18, 19, wherein the gas feeds 18, 19 are connected to gas containers 22, 23 via valves 20, 21. The upper region of chamber 15 is electrically at ground while a lower region 24, 25 of chamber 15 is connected with the positive potential of a voltage source 26.

The substrate 27 which is to be coated in the coating installation 1 is located on a cylinder 28 which rotates in the direction of arrow 29.

Between the upper region of chamber 15 and the lower region 24 the ion source 3 is provided as it is described in the German Patent Application P 38 03 355.0.

This ion source 3 has a gas inlet 30 across which the gas streams into a quartz container 31. By means of electromagnetic waves transmitted by a horn radiator 32, the gas is ionized. Due to the magnetic field distribution which is brought about by permanent magnets 33, 34, within the quartz container 31 is formed a "race track" for electrons and ions as it is known in the case of magnetron sputter cathodes. Thus, it becomes possible to significantly increase the degree of ionization which has heretofore been limited due to microwave irradiation. An advantage of the toroidal magnetic field compared to other magnetic fields arises in that, in the marginal area of the quartz container 31, i.e. in the active region of the electromagnetic AC field, a magnetic field is created which fulfills the electron cyclotron resonance conditions. A zone with very high ionization efficiency is created which encloses the plasma region for particle extraction and which supplies in this plasma region the plasma components to be extracted. The superimposed magnetic field of an electromagnet 35 produces, depending on the direction of the magnetic field generated, a radial contraction or a radial expansion of the ECR excitation region so as to control of the plasma density distribution in container 15.

The plasma in the container 15, indicated in FIG. 1 by dots, can function with the aid of special control methods as an ion source, electron source or as a source for neutral particles. If, for example, a grid 36 is at a positive potential, a grid 37 at a negative potential, and a grid 38 at zero potential (=ground), the negatively charged particles (electrons, negative ions) remain captured in the container while the positively charged particles (positive ions) are drawn off.

On the right side of the housing 15 the second particle source 4 is provided which is structured entirely differently and described in detail in the German Patent Application P 38 34 984.1.

In this particle source 4, which is gyromagnetically tunable, the principle of electron cyclotron resonance is likewise applied. Herein a quartz vessel 40 for receiving the plasma is provided which has on its upper side an indentation 41 and on its under side is provided with an extraction grid 42 with which ions can be drawn off. With a pure plasma extraction this grid 42 is omitted. Around the quartz vessel 40 a resonant cavity 43 is provided which has an opening 44 through which a microwave coupler 45 enters a space 46 located above the quartz vessel 40. Coupling of the microwave, can take place capacitively, inductively, or via a wire. FIG. 1 shows a capacitive coupling in which the end of an open line projects into a hollow space and is preferred where large electrical field strengths occur.

The resonant cavity 43 is conformed to the indentation 41, i.e. it also has an indentation 47, in which an annular coil 48 is located which surrounds a vertical web of a soft iron core 49 which is T-shaped in cross section. This coil 48 functions to establish the electron cyclotron resonance conditions. If the coupled-in microwave has a frequency of 2.45 GHz, then the magnetic flux density generated by coil 48 is $8.75 \times 10^{-2}$ V*s/m$^2$ so that the ECR condition is fulfilled.

The resonant cavity 43 conforms essentially to the outer contours of the quartz vessel 40. However, in the upper region, two hollow spaces 46 and 50 are formed in the resonant cavity 43, forming an annulus which at least partially surrounds the coil 48. This annulus 46, 50 is closed at its upper side with a thin annulus 51, 52 of a gyromagnetic material, for example ferrite.

Above this annulus 51, 52 and on the resonant cavity 43 is located a rotationally-symmetrical soft iron core 53 into which a circular tuning coil 54 for the gyromagnetic setting of the resonance frequency of the resonant cavity 43 is embedded.

The resonant cavity 43 in the arrangement according to FIG. 1 represents a capacitively loaded resonator which against the outside is completely closed off through conducting but magnetically non-shielding walls, for example of copper or aluminum. By changing the total height of the resonant cavity 43 and/or the height of the indentation 47 projecting above the floor of indentation 41 and/or the total diameter of the resonant cavity 43 and/or the diameter of the indentation 47, a field configuration stable in the resonant cavity 43 as well as also a capacitive load can be varied over a wide range and in this way adapt an optimum operating point to the plasma and ion source 4. For this plasma and ion source 4 the gyromagnetic annulus 51, 52 in connection with the coil 54 is important through the magnetic field of which a detuning of the resonant cavity 43 can be effected.

For the present invention the plasma and ion source 3 as well as also the plasma and ion source 4 can be used. The joint representation of the two different ion sources in FIG. 1 serves solely the purpose of simplifying the representation. Two identical particle sources or only one particle source could equally well be provided as long as the particle beam of sources 3, 4 are directed toward the substrate to be coated. With the aid of the combination of one or several of the particle sources 3, 4 and the magnetron sputtering cathode 2, connecting layers are produced on a substrate. In the particle source 3, 4 itself the reactive gas particles are produced which are guided to the substrate where they react with the sputtered-on atoms of the magnetron target 5.

The combination of magnetron sputter cathode with particle sources to guide ions of the reactive gases to the substrate is possible in further variations.

Figure 2:
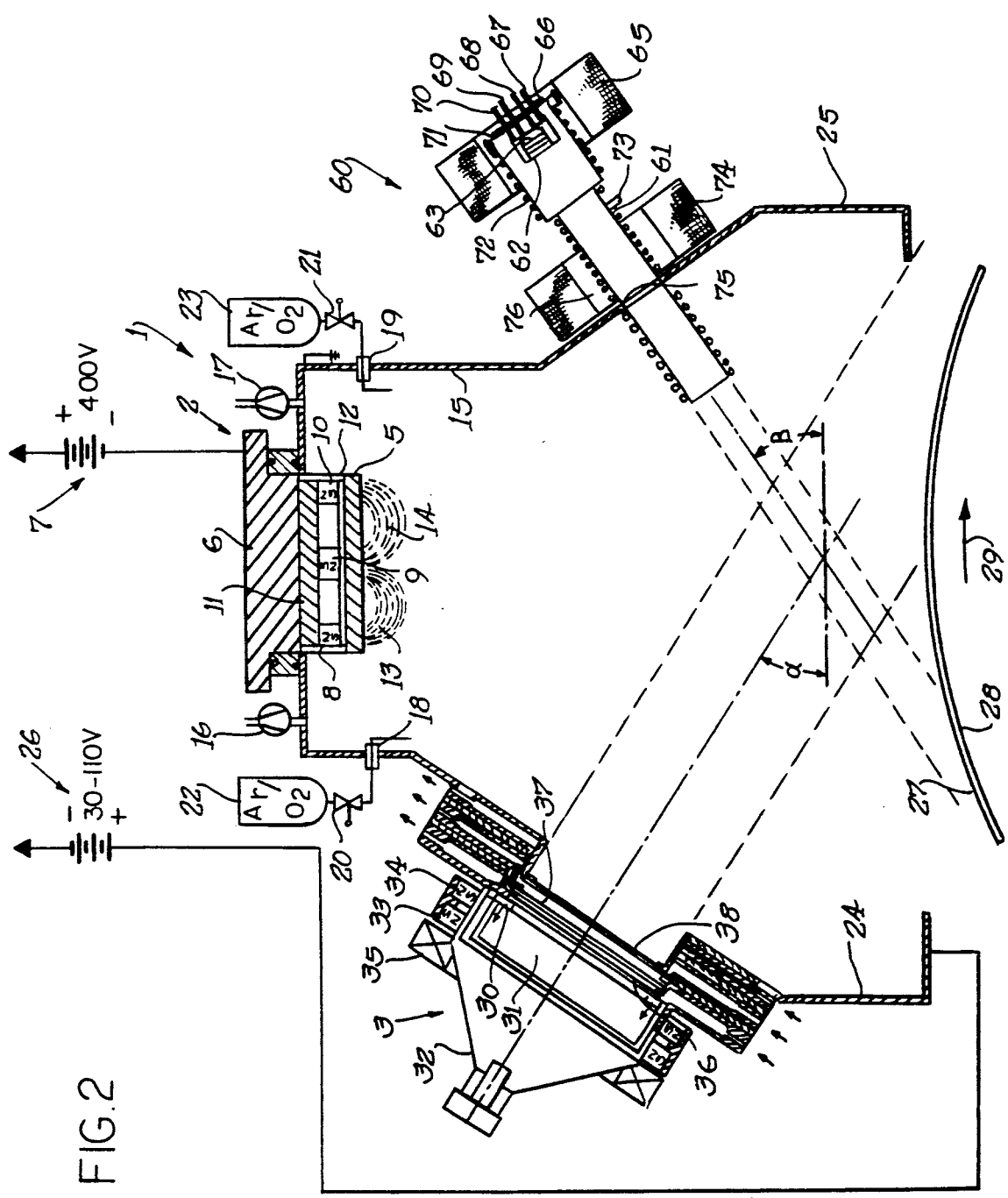
FIG. 2—shows a second sputter installation with another ion source.

Such a variation is shown in FIG. 2. This FIG. 2, which for the remainder is structured like FIG. 1, shows an ion source 60 as it is described in the above cited paper by Goebel, Campbell and Conn. Components of this ion source 60 are a tubular anode 61, an electron emitter 62, a heating system 63, a generator chamber 64, a magnet coil 65, a perforated plate 66, water and power feeds 67, 68, 69, 70, a pipe socket 71, a pipe coil 72, an inlet nozzle 73, an additional magnet coil 74, an opening 75 and a flange 76.

Figure 3:
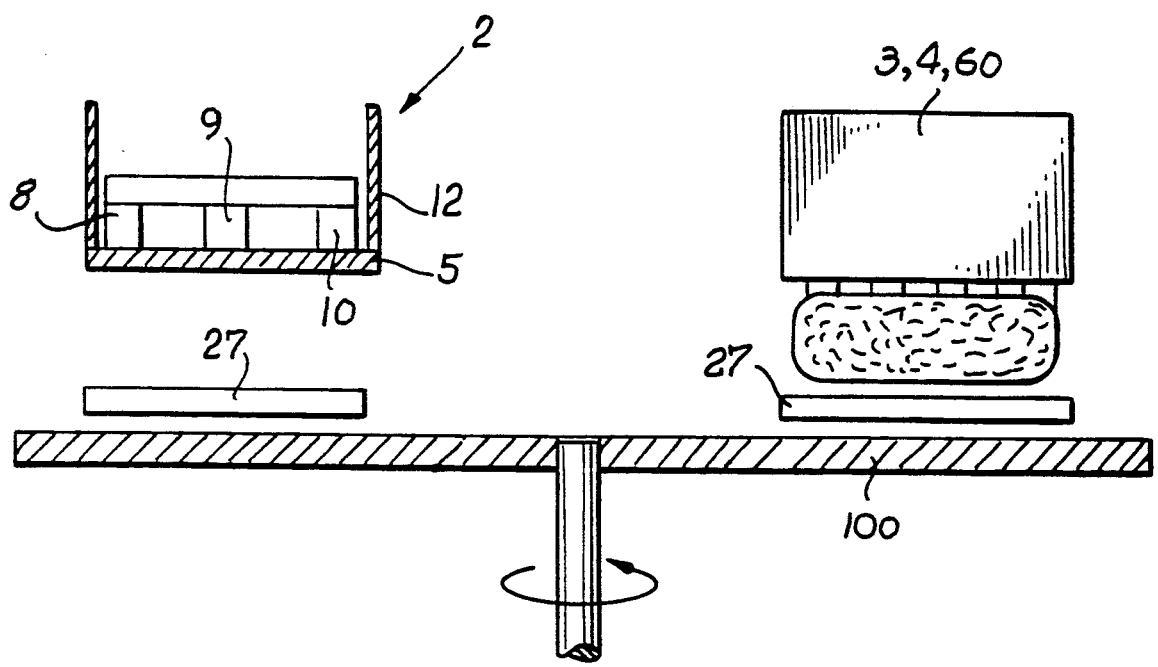
FIG. 3—shows an arrangement in which a magnetron cathode and an additional plasma source are arranged spatially separated from each other.

In the configuration according to FIG. 3 the magnetron cathode 2 and the additional ion and plasma sources 3, 4, 60 are disposed spatially entirely separated from each other. On a revolving table 100 is located the substrate 27 in a first position below the magnetron cathode 2, while in a second position it is below the ion source 3, 4, 60. In this configuration the substrate 27 must be guided very rapidly below the magnetron cathode 2 and the particle ion source 3, 4 60 in order for the particles sputtered on the substrate 27 to be able to react completely with the reaction particles. In this configuration a second magnetron cathode could also function as plasma source for ions in which the sputter effect is strongly suppressed.

As already stated, in the configuration according to FIG. 1 the substrate 27 to be coated is disposed on a cylinder 28. Instead of a cylinder 28 a conveyor table can also be provided for the substrate and which moves between the two ion sources, for example into the plane of projection. It is particularly advantageous if the substrate is located where the particle streams undergo maximum mixture, for example in the plane which is represented as reference line for the angles A and B.

What is claimed is:

1. Apparatus for the vapor deposition of thin layers on a substrate surface, with a magnetron cathode which has a target to be disintegrated and which is disposed opposite the substrate, wherein the particles knocked from the target form with reactive gases a compound which is deposited as a thin layer on the substrate, the apparatus including:

the magnetron cathode further comprising an electrode and permanent magnetic means between the magnetron cathode electrode and the target for producing a magnetic cusp field adjacent the target;

at least two ion particle generator means between the target and the substrate for generating beams of ion particles of a reactive gas;

means for injecting said reactive gas between the magnetron cathode and the ion particle generator means;

housing means for spacing the target, the particle generator means and the substrate apart from one another by a cavity region substantially free of particles of the reactive gas; and electromagnetic means for electromagnetically accelerating and directing the ion beams along intersecting axes which are angularly offset from one another and from the substrate surface into the vicinity of the substrate so as to react the ions with particles from the target at a location immediately above the substrate.

2. The apparatus as stated in claim 1, characterized in that one ion particle generator (3) has a plasma space (31) in which by means of microwave irradiation and penetrating magnetic fields electron cyclotron resonances originate, and the ion particles are accelerated by means of electrical or magnetic potentials in the direction of the substrate.

3. The apparatus as stated in claim 1, characterized in that one ion particle generator (4) has a gyromagnetically tunable resonant cavity for microwaves in which plasma are generated, wherein said ion particles are accelerated toward the substrate with the aid of electrical or magnetic fields.

4. The apparatus as stated in claim 1, characterized in that one ion particle generator (60) comprises an anode (61), an electron emitter (62), a heating system (63), a generator chamber (64), and a magnet coil (65), wherein in the generator chamber said ion particles are generated which are accelerated directly toward the substrate by means of electrical or magnetic fields.

5. The apparatus as stated in claim 1, characterized in that the ion particle generator means comprises two ion particle generators (3,4) disposed essentially mirror-symmetrically to the magnetron cathode (2) so that the emitted ion particles of these generators (3,4) meet above the substrate.

6. The apparatus as stated in claim 5, characterized in that the center axes of the ion particle generators (3,4) are angularly offset from one another.

* * * * *

UNITED STATES PATENT AND TRADEMARK OFFICE
CERTIFICATE OF CORRECTION

PATENT NO. : 5,122,252

DATED : June 16, 1992

INVENTOR(S) : Rudolf Latz, et al.

It is certified that error appears in the above-identified patent and that said Letters Patent is hereby corrected as shown below:

In Column 3, line 22, after the word "microwave" delete the comma ",".

In Column 3, line 25, change the word "and" to read --as--.

In Column 4, line 3, change the word "beam" to read --beams--.

In Column 4, line 38, after the word "stated" delete the comma ",".

In Column 5, line 20 (Claim 3, line 4), change the word "plasma" to read --plasmas--.

Signed and Sealed this

Thirty-first Day of August, 1993

Attest:

BRUCE LEHMAN

Attesting Officer

Commissioner of Patents and Trademarks